United States Patent [19]

Lee et al.

[11] Patent Number: 5,675,386
[45] Date of Patent: Oct. 7, 1997

[54] METHOD FOR ENCODING MOTION IMAGE AND APPARATUS THEREFOR

[75] Inventors: Shi-hwa Lee; Jae-Seob Shin, both of Seoul, Rep. of Korea

[73] Assignee: Samsung Electronics Co., Ltd., Suwon, Rep. of Korea

[21] Appl. No.: 565,758

[22] Filed: Nov. 30, 1995

[30] Foreign Application Priority Data

Nov. 30, 1994 [KR] Rep. of Korea .................. 94-32135

[51] Int. Cl.$^6$ .................................................... H04N 7/36
[52] U.S. Cl. .................................... 348/416; 348/420
[58] Field of Search .................................... 348/400, 401, 348/402, 405, 409, 411, 412, 413, 415, 416, 419, 420; 382/236, 238, 240, 251

[56] References Cited

U.S. PATENT DOCUMENTS

| 5,107,345 | 4/1992 | Lee ............................. 348/420 |
| 5,214,506 | 5/1993 | Lin et al. ...................... 358/183 |
| 5,253,058 | 10/1993 | Gharavi ........................ 358/136 |
| 5,351,086 | 9/1994 | Park ............................ 348/402 |
| 5,469,212 | 11/1995 | Lee ............................. 348/409 |

OTHER PUBLICATIONS

Liou, "Visual Telephony as an ISDN Application", IEEE Communication Magazine, vol. 28(2), pp. 30–38, Feb. 1990.
Strobach, "Tree-Structured Scene Adaptive Coder", IEEE Transactions on Communications, vol. 38, No. 4, pp. 477–485, Apr. 1990.

*Primary Examiner*—Amelia Au
*Attorney, Agent, or Firm*—Foley & Lardner

[57] ABSTRACT

A method for encoding a motion image and an apparatus therefor includes first and second buffers, a motion estimator/compensator, an MC error generator/divider, first and second quadtree processors, a multiplexer, a quantizer, a variable length coder, a bit rate controller, an inverse quantizer, first and second inverse quadtree processors, and an adder/filter. Here, MC errors generated after motion compensation are divided into accumulated and compensation errors according to the characteristics, and then encoded. Thus, bit generation can be reduced compared with the conventional method, picture quality can be improved, and a process structure can be simplified.

9 Claims, 10 Drawing Sheets

ORIGINAL SIGNAL

ACC ERROR

ORIGNAL SIGNAL + ACC ERROR

RECONSTRUCTED SIGNAL
(LOW PASS FILTERING)

MEMC ERROR

ORIGNAL SIGNAL + MEMC ERROR

QUADTREE SPLIT

RECONSTRUCTED MEMC ERROR

RECONSTRUCTED SIGNAL(F)-(H)

METHOD FOR ENCODING MOTION IMAGE AND APPARATUS THEREFOR

BACKGROUND OF THE INVENTION

The present invention relates to a method and apparatus for encoding a motion image, and more particularly, to a method and apparatus for encoding a motion image in which a motion compensation error (MC error) generated after motion compensation is separated into accumulated errors and compensation errors according to distribution characteristics in a predetermined area, and encoded according to each distribution characteristic.

In general, a motion image encoder which has been widely used removes temporal overlap through motion processing, spatial overlap through discrete cosine transform (DCT), to thereby compress data.

FIG. 1 shows a basic structure of a motion image encoder designed such that temporal overlap can be removed through the motion processing and spatial overlap through the DCT, and is for use in a number of standardized encoders such as H.261, MPEG-1 and MPEG-2.

Referring to FIG. 1, a motion estimator 11 generates motion vectors for constituting current images in reference to previous images. In order to generate a motion vector, most encoders perform a full search within a predetermined range on the basis of minimum absolute errors (MAE), with a fixed block unit. The motion vector generated from motion estimator 11 is transmitted to a frame memory and motion compensator 17, and formed into a motion compensated image through motion compensation in reference to a reconstructed image of previous images which are in advance stored in a memory. Accordingly, the motion compensated image becomes very similar to the current image through motion estimation by motion estimator 11 and the motion compensated image by frame memory and motion compensator 17.

A subtracter 18 calculates a difference between the current image and the motion compensated image, to generate an MC error. That is, when the motion compensated image is added to the MC error, the complete current image is generated. The MC error is transmitted to a DCT 12, and then is transformed from a spatial area to a frequency area.

A quantizer (Q) 13 quantizes the MC error transformed in DCT 12 according to a quantization step-size generated in a bit rate controller 18. The MC error quantized in quantizer 13 is variable-length-coded in a variable length encoder 19, transmitted to a buffer 21, i.e., to the final step of the encoder through a multiplexer 20, and then transmitted to a decoder.

In an inverse quantizer ($Q^{-1}$) 14 and an inverse DCT ($DCT^{-1}$) 15 serving as inverse transform processors of quantizer 13 and DCT 12, the MC error is inversely quantized and discrete-cosine-transformed, respectively, and then added to the motion compensated image in an adder 16, to thereby generate a reconstructed image of the current image. The reconstructed image is stored in the frame memory and motion compensator 17. Here, the generated reconstructed image is perfectly the same as the reconstructed image generated in the decoder.

Accordingly, the data transmitted to the decoder from the encoder are an MC error where a part of the motion vector and the data are lost. In the decoder, the motion compensated image is constituted by using the received motion vector, and then the MC error is inversely transformed, to thereby generate a same reconstructed image as the reconstructed image stored in frame memory and motion compensator 17.

The MC error from the subtracter 18 is generated due to two causes. First, when more than two different motion components exist in a block by estimating motion with the fixed block unit by motion estimator 11, frame memory and motion compensator 17 cannot perform exact motion compensation, as a result, to thereby generate errors from the motion compensated image and an original image. Here, such an error is referred to as a compensation error. The compensation error has the characteristics that much of them are generated from a boundary edge of an object moving in an image, but few from other places. Such an effect is called a line drawing effect as described in Stroback, "Tree-Structured Scene Adaptive Coder," IEEE Transactions on Communications, vol. 38, no. 4, April 1990, pp. 477-485.

Second, the MC error is generated due to an accumulated error. When the MC error is completely encoded through various processes as follows, no error is generated from the reconstructed image. However, an error is generated while quantization is performed by a quantization step-size predetermined by bit rate controller 18 according to a target bit transmission rate. Accordingly, errors exist in the reconstructed image generated from the decoder, the frame memory and motion compensator 17. Such errors are accumulated while a process with respect to an image is continued, and have no a high value, but are very widely and randomly distributed.

Therefore, the MC error has characteristics of both a compensation error and an accumulated error, because the MC error is generated by combining both errors. That is, the MC error has a high value at the boundary area of the moving object in the image like the compensation error and a low error value is irregularly distributed over all areas like the accumulated error.

The above-described MC error is transformed from the spatial area to the frequency area through DCT so that concentration of power is expectable. However, the concentration of power through DCT is admitted only in the case that values of each pixel in the spatial area are greatly co-related. Since the MC error has the characteristics of the irregular distribution by the accumulated error. When DCT is performed with respect to the MC error having the irregular distribution, the power is not concentrated, but rather dispersed.

Therefore, Strobach suggested an encoding method through a quadtree as a substitute, pointing out that DCT process with respect to the MC error is insufficient.

In the case of the encoding through the quadtree, when pixels in blocks have similar values with respect to a block of a predetermined size, an average value of the values in the blocks is encoded, but when pixels in the blocks have very different values, the blocks are divided into four sub-blocks, then similarity in values in each sub-block is judged with respect to the four sub-blocks. In this way, an average value in each block and a structure of the quadtree are encoded by continuously dividing each block into four pieces until meeting a predetermined condition.

However, Strobach considered only characteristic of compensation errors as the characteristic of the MC error, thus, he paid no regard to the characteristic of the irregular distribution of the accumulated errors. That is, motion image signals have a high dispersion value due to not only errors concentrated on the boundary edge of the moving object but also the irregular distribution of the accumulated errors in other areas. Therefore, when the MC errors are encoded through the quadtree, all areas should be divided into a lot of small pieces. Accordingly, a volume of information increases due to encoding of average values with respect to each area, including information on the structure of the quadtree to be encoded.

Meanwhile, since the average value tends to be close to 0 due to the irregular distribution of the accumulated errors, a remarkable error compensation effect is not obtained by the average value.

FIG. 2 shows the number of leaf nodes generated when compensation errors, accumulated errors, and MC errors (compensation errors+accumulated errors) are divided through a quadtree by applying a uniform dispersion threshold 400. Here, it can be seen that the number of leaf nodes in the compensation errors are far more than in the accumulated errors, accordingly, the MC errors become more.

As mentioned above, the conventional DCT process widely used for encoding MC errors is proved to be inefficient because of the irregular distribution of the MC errors and high frequency components at the edge. Besides, the quadtree process proposed as a substitute is also proved to be inefficient because of the irregular distribution of the MC errors.

Meanwhile, errors are generated in the step of quantization according to the quantization step-size generated from bit rate controller 18 by data loss generated during encoding. In case that a target bit transmission rate is high, the quantization step-size is small, and thus, errors are few. However, in case that a target bit transmission rate is low, the quantization step-size is large, and thus, the errors are very large so that picture quality of reconstructed images is deteriorated.

In particular, in the case of motion image encoding with a very low transmission rate of less than 64 kips, the process of the usual DCT or quadtree structure has a very large quantization step-size due to the limited transmission rate, which causes great loss of data to be generated. As a result, the phenomena of a blocking effect that a persistence image of the same size as that of a processed block remains on a screen, a mosquito effect that errors are concentrated at a boundary of a moving object in the form of dots, and discordance of boundary lines of an object, are generated, to thereby remarkably lower the picture quality.

SUMMARY OF THE INVENTION

Accordingly, it is an object of the present invention to provide a method for encoding a motion image in which MC errors generated after motion compensation are divided into accumulated errors and compensation errors according to distribution characteristics in a predetermined area, and then encoded, thereby allowing effective bit generation and reconstructed images.

It is another object to provide an apparatus appropriate for achieving the above method.

To accomplish the above object of the present invention, there is provided a method for encoding a motion image comprising the steps of (a) generating motion vectors by performing motion estimate with respect to current original images referring to previous original images, and generating motion compensated images referring to said motion vectors and reconstructed images of the previous original images;

(b) dividing MC errors generated after performing said step (a) into accumulated errors and compensation errors;

(c) quadtree-processing said accumulated and compensation errors divided in said step (b) according to the characteristic of each error;

(d) quantizing with respect to an average in each quadtree of said accumulated and compensation errors processed in said step (c), and determining a quantization coefficient according to a predetermined quantization step-size;

(e) variable-length-coding the data quantized in said step (d);

(f) storing the data output from said step (e);

(g) determining the quantization step-size to be provided to said step (d) according to a volume of said data stored in said step (f);

(h) inversely transforming said data quantized in said step (d) into the data before quantization;

(i) performing an inverse quadtree process with respect to block having an average value in a predetermined sub-block of the data output from said step (h), to generate reproduction compensation errors and accumulated errors; and (j) generating first reconstructed images from said reproduction compensation errors and accumulated errors generated from said step (i), and said motion compensated images generated from said step (a), and then generating final reconstructed images through low pass filtering.

To accomplish another object of the present invention, there is provided an apparatus for encoding a motion image comprising:

a first buffer for storing previous original images and current original images;

a motion estimator/compensator for generating motion vectors by performing motion estimate with respect to said current original images referring to said previous original images stored in said first buffer, and for generating motion compensated images referring to said generated motion vectors and reconstructed images of said previous original images;

MC errors generator/divider for generating MC errors by said motion compensated images generated by said motion estimator/compensator and said current original images, and for dividing said MC errors into compensation errors and accumulated errors;

first and second quadtree processors for performing a quadtree process so as to encode said compensation and accumulated errors output from said MC error generator/divider;

a switching portion for switching and outputting said motion vectors generated by said motion estimator/compensator and the data output from said first and second quadtree processors;

a quantizer for quantizing an average value in a quadtree of the output data from said switching portion, and for determining a quantization coefficient according to a predetermined quantization step-size;

a variable length coder for performing variable length coding with respect to said data quantized by said quantizer;

a second buffer for storing the output data from said variable length coder;

a bit rate controller for determining said quantization step-size to be provided to said quantizer according to a volume of the data stored in said second buffer;

an inverse quantizer for transforming said data quantized by said quantizer into the data before quantization;

first and second inverse quadtree processors for performing inverse quadtree process with respect to blocks with an average in a predetermined sub-block of said output data from said inverse quantizer, to generate reproduction compensation errors and accumulated errors; and an adder/filter for generating first reconstructed images by adding said reproduction compensation and accumulated errors output from said first and second inverse quadtree processors to said motion compensation images output from said motion estimator/compensator, and for generating final reconstructed images by processing irregularly distributed errors through filtering.

BRIEF DESCRIPTION OF THE DRAWINGS

The objects and other advantages of the present invention will become more apparent by describing in detail a preferred embodiment thereof with reference to the attached drawings in which.

DETAILED DESCRIPTION OF THE INVENTION

The present invention will be in detail described referring to accompanying drawings.

Figure 1:
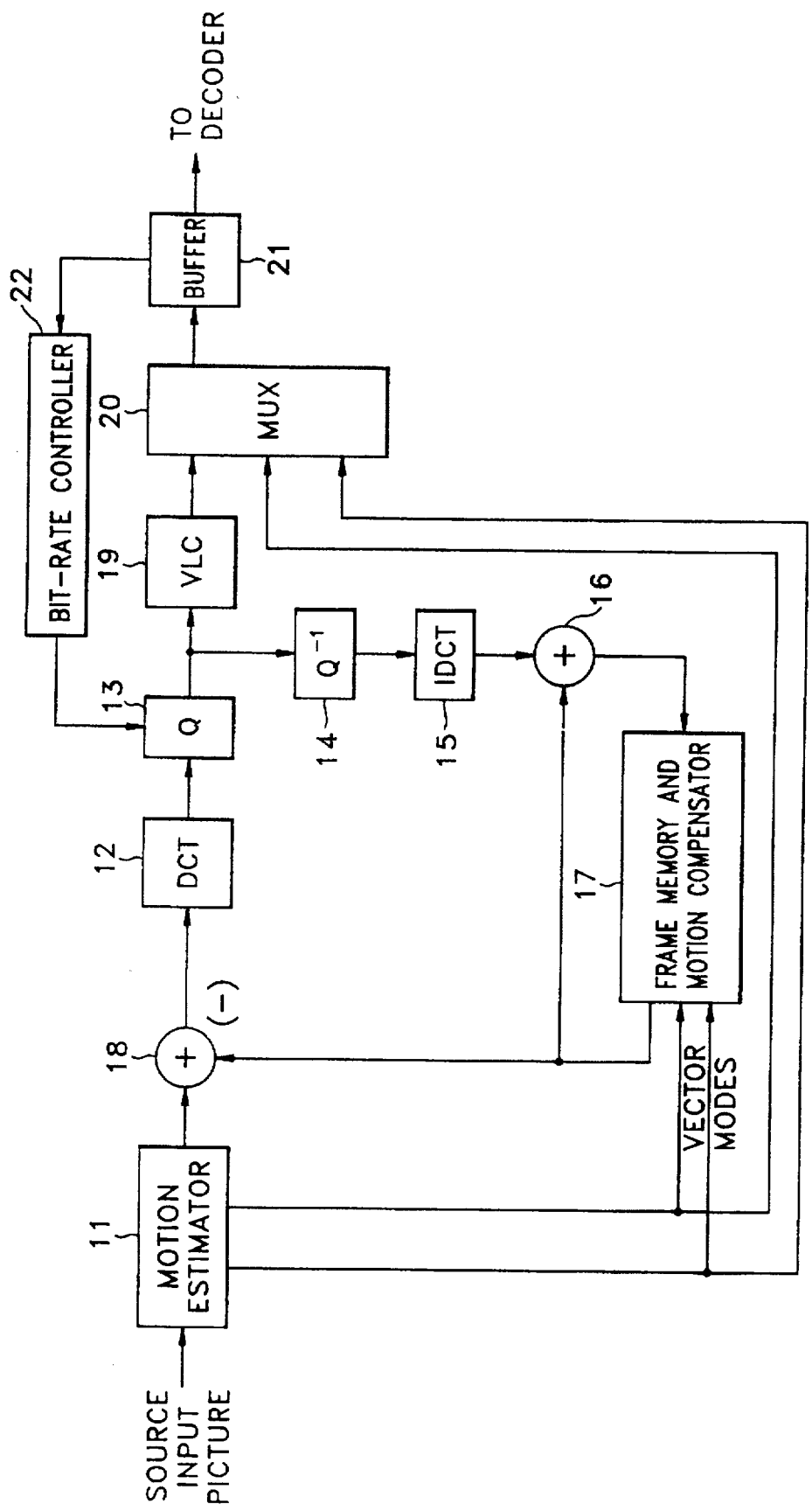
FIG. 1 shows a structure of a conventional motion image encoder.
Figure 2:
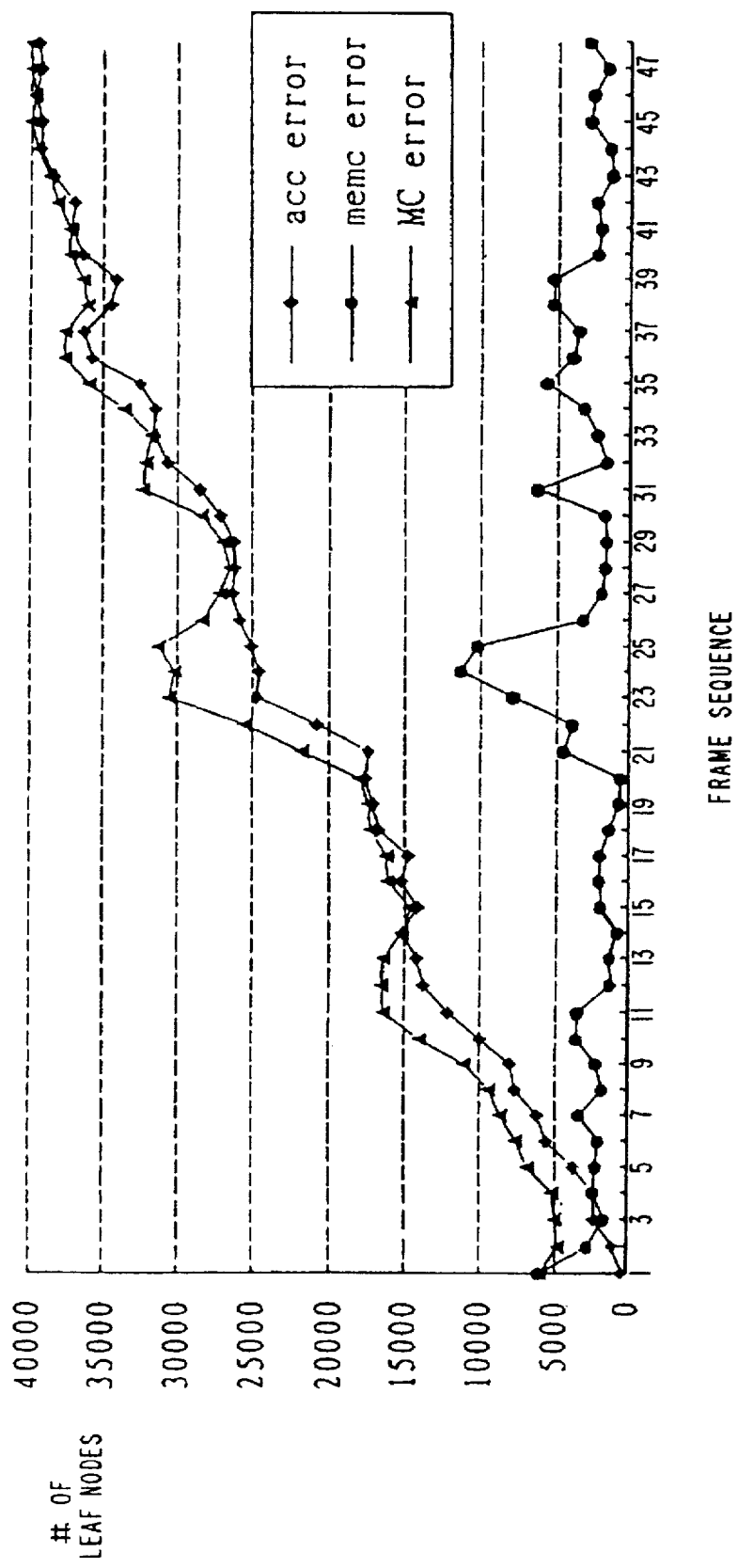
FIG. 2 shows the number of leaf nodes generated when compensation errors, accumulated errors and MC errors are processed through a quadtree method.
Figure 3:
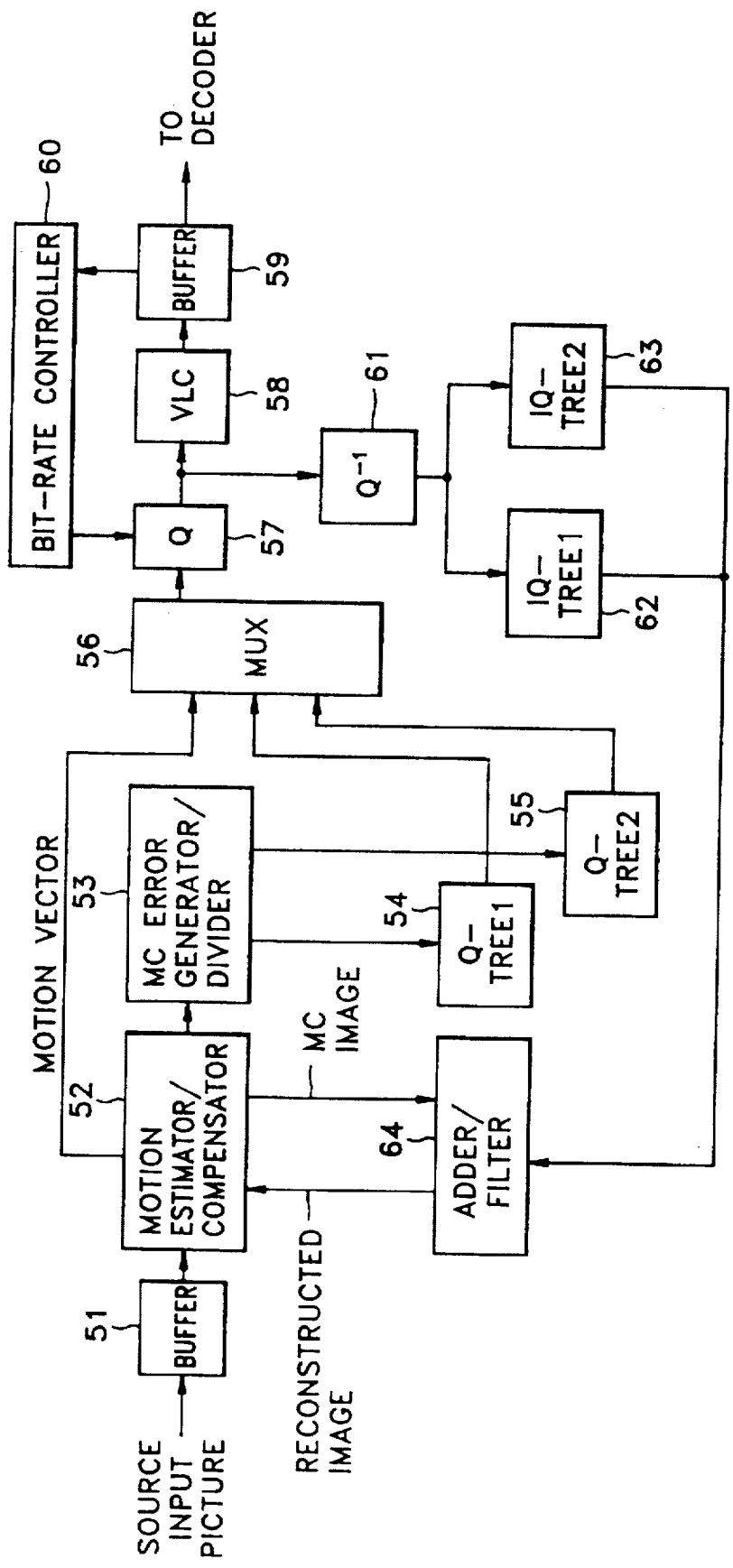
FIG. 3 is a block diagram showing an apparatus for encoding a motion image according to the present invention.

Referring to FIG. 3, an apparatus for encoding a motion image according to the present invention, comprises: first and second buffers 51 and 59, a motion estimator/compensator 52, an MC error generator/divider 53, first and second quadtree processors 54 and 55, a switching portion, for example, a multiplexer 56, a quantizer 57, a variable length coder 58, a bit rate controller 60, an inverse quantizer 61, first and second inverse quadtree processors 62 and 63, and an adder/filter 64.

In operation of the apparatus for encoding the motion image shown in FIG. 3, first buffer 51 stores current and previous original images, motion estimator/compensator 52 generates motion vectors by performing motion estimation with respect to current images referring to the previous original images stored in first buffer 51, and generates motion compensated images referring to the generated motion vectors and the reconstructed images of the previous original images which are stored.

MC error generator/divider 53 generates MC errors by the motion compensated images generated by the motion estimator/compensator 52 and the current original images, and generates accumulated errors and compensation errors by dividing the MC errors.

First and second quadtree processors 54 and 55 each perform quadtree processes for encoding with respect to the compensation errors and the accumulated errors output from MC error generator/divider 53.

Multiplexer 56 receives the motion vectors generated from motion estimator/compensator 52 and the data output from first and second quadtree processors 54 and 55, sequentially select the input motion vectors and data, and then transmits them into a decoder (not shown).

Quantizer 57 performs quantization with respect to an average value during the quadtree process from the data provided by multiplexer 56, and determines a quantization coefficient according to a quantization step-size provided by bit rate controller 60.

Variable length coder 58 performs variable length coding with respect to the data quantized by quantizer 57, and second buffer 59 stores the data output from variable length coder 58.

Bit rate controller 60 determines the quantization step-size to be provided to quantizer 57 according to a volume of the data stored in second buffer 59, and inverse quantizer 61 performs operation opposite to that of quantizer 57 and transforms the quantized data into the form similar to data before quantization.

First and second inverse quadtree processors 62 and 63 generate reproduction compensation errors and reproduction accumulated errors by extracting only blocks having an average value in a predetermined sub-block from the output data from inverse quantizer 61.

Adder/filter 64 generates first reconstructed images by adding the reproduction accumulated and compensation errors to motion compensated images which are output from motion estimator/compensator 52, then generates final reconstructed images by processing the irregularly distributed errors through filtering.

To begin with, the characteristics of the MC errors having both the characteristic of the accumulated errors and that of the compensation errors, can be expressed as follows:

$$e_t = MC(ME(x_{t-1}), \bar{x}_{t-1}) - x_t \quad (1)$$
$$= |e_{meme} + e_{acc}|$$

where $e_t$ denotes MC errors, t denotes time, ME(k) denotes motion vectors generated referring to an image "k", MC(v,k) denotes a reconstructed image by using motion vectors "v" and referring to the image "k", $\bar{x}_t$ denotes a reconstructed image for a period of time "t" and $x_t$ denotes an original image for the period of time "t", respectively.

In the following formula (2), the MC errors "$e_t$" expressed as formula (1) are divided into the compensation errors ($e_{meme}$) and the accumulated errors ($e_{acc}$), so that an appropriate process for the distribution characteristics of each error is possible.

$$e_t = MC(ME(x_{t-1}), \bar{x}_{t-1}) - x_t \quad (2)$$
$$= MC(ME(x_{t-1}), \bar{x}_t) - x_t + e_{acc}$$
$$= e_{meme} + e_{acc}$$

Here, "$e_t$" can be gained by the formula (1). Since "$e_{meme}$" is "$MC(ME(x_{t-1}), \bar{x}_{t-1})$", the accumulated and compensation errors can be gained by "$e_{acc} = e_t - e_{meme}$". The compensation errors are distributed concentrating on the outer edge of an moving object but have a very small value in other areas. In case that the compensation errors of which error values have been already concentrated in the limited area are divided through the quadtree process into small pieces, an effective encoding is possible. In the other areas, the encoding is not performed because an average value is close to 0.

Meanwhile, the accumulated errors are very irregularly distributed all over images, most have small values, and an average value of the accumulated errors in large blocks are mostly 0. Accordingly, low pass filtering is enough to enable an effective process without transmitting any more data. However, since the accumulated errors are generated from an incomplete process of the compensation errors, the accumulated errors are processed in the same method as in the compensation errors through the quadtree process. Here, since the accumulated errors are hardly divided into smaller pieces than in the case of the compensation errors, and they have still small values and an irregular distribution even though being processed by the average value, the low pass filtering is performed after being processed by the average value.

Figure 4:
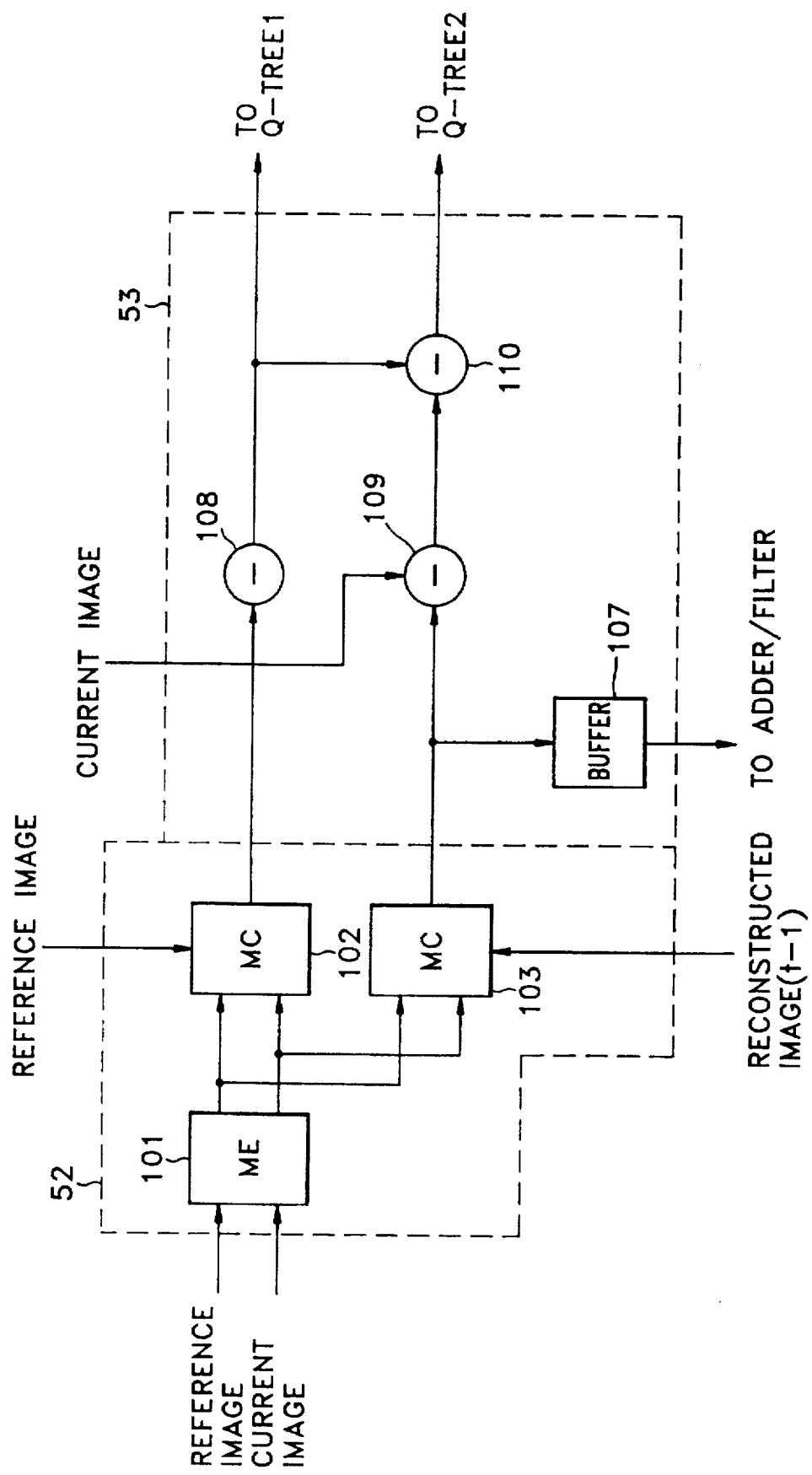
FIG. 4 is a detailed block diagram of a motion estimator/compensator and an error generator/divider shown in FIG. 3.

FIG. 4 is a detailed block diagram of motion estimator/compensator 52 and error generator/divider 53 shown in FIG. 3. Here, motion estimator/compensator 52 comprises a motion estimator 101 and first and second motion compensators 102 and 103. MC error generator/divider 53 comprises a buffer 107 and first through third subtracters 108, 109 and 110. In operation of motion estimator/compensator 52 shown in FIG. 4, motion estimator 101 generates motion vectors, first motion compensator 102 generates a first motion compensated image by using the motion vectors output from motion estimator 101 and referring to previous original images, and second motion compensator 103 generates second motion compensated images by using the motion vectors output from motion estimator 101 and referring to reconstructed images of the previous original images.

In operation of MC error generator/divider 53, buffer 107 stores the second MC images output from second motion compensator 103, and constitutes reconstructed images, first subtracter 108 generates compensation errors by gaining a difference between the first motion compensated images output from first motion compensator 102 and current original images, second subtracter 109 generates MC errors by gaining a difference between the motion compensated output from second motion compensator 103 and the current original images, and third subtracter 110 generates accumulated errors by gaining a difference between the MC errors output from second subtracter 109 and the compensation errors output from first subtracter 108.

Figure 5:
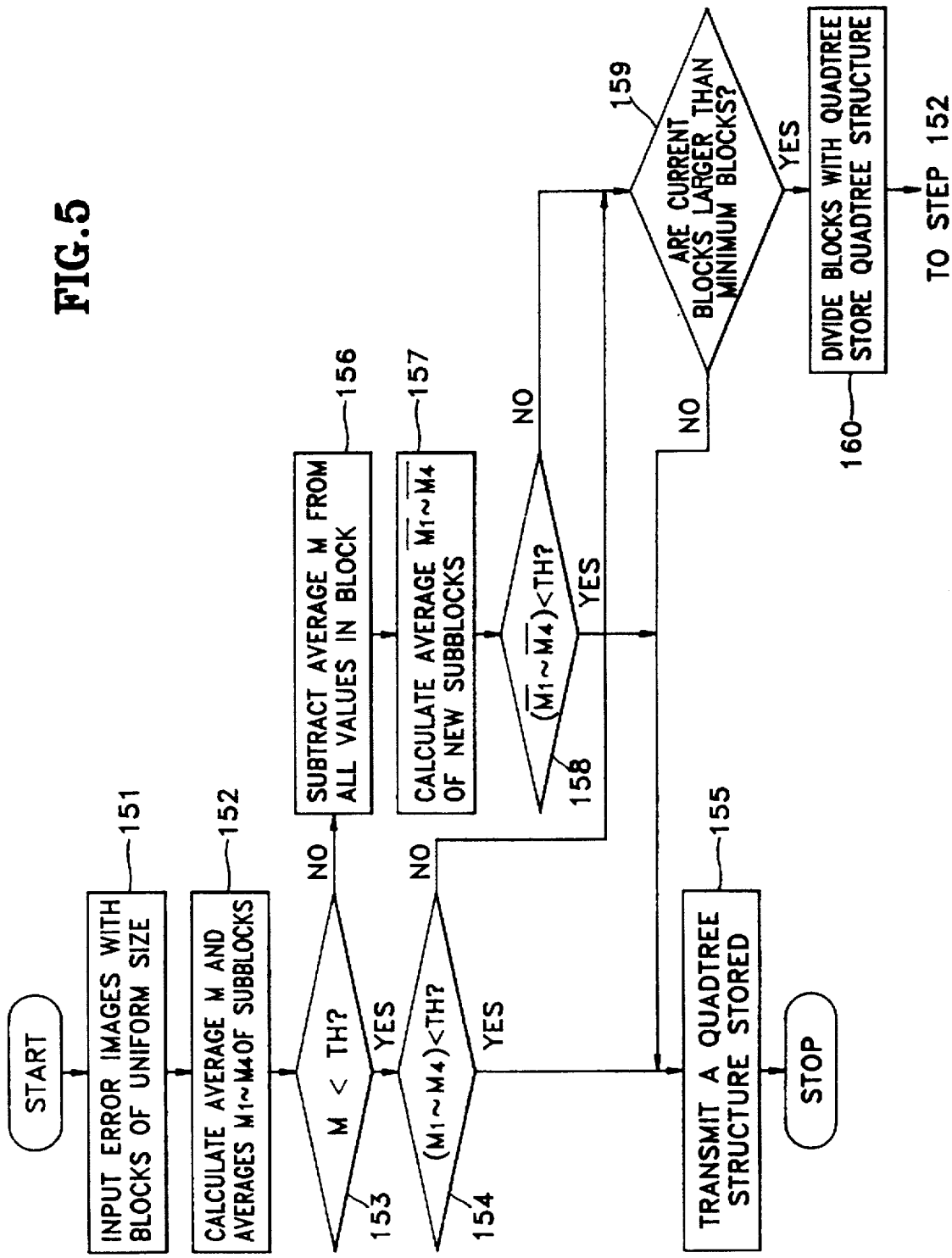
FIG. 5 is a flowchart for illustrating operation of first and second quadtree processors shown in FIG. 3.

FIG. 5 is a flowchart for illustrating operation of first and second quadtree processors 54 and 55 shown in FIG. 3.

In step 151, error images of a predetermined block size are input, then in step 152, an average value "M" of a whole block and average values M1, M2, M3, and M4 of four sub-blocks divided through quadtree are calculated.

In step 153, it is decided whether the average value "M" is smaller than a predetermined threshold "TH". In step 154, it is decided whether average values M1, M2, M3, and M4 of the sub-blocks are smaller than the threshold "TH" when the average value "M" is smaller than the threshold "TH". When the average value M1, M2, M3, and M4 of the sub-blocks are all smaller than the threshold "TH" in step 154, split through the quadtree method is ceased, and the quadtree structures stored so far are transmitted to multiplexer 56 of FIG. 4 (step 156).

Meanwhile, when the average value "M" is larger than the threshold "TH" in step 153, the average value "M" is subtracted from all values in the block to generate a new value of the block (step 156) and generate new average values $\overline{M1}, \overline{M2}, \overline{M3}, \overline{M4}$ of the sub-blocks (step 157). In step 158, it is decided whether the average values $\overline{M1}, \overline{M2},$ $\overline{M3}, \overline{M4}$ of the sub-blocks generated in step 157 are smaller than the threshold "TH". When all average values $\overline{M1},$ $\overline{M2}, \overline{M3}, \overline{M4}$ of the sub-blocks are smaller than the threshold "TH", split through the quadtree method is ceased, and the quadtree structures stored so far are transmitted to multiplexer 56 of FIG. 4 (step 155).

Meanwhile, when at least one of the average values $\overline{M1}, \overline{M2}, \overline{M3}, \overline{M4}$ of the sub-blocks is larger than the threshold "TH" in step 158, it is decided whether a current block is larger than a minimum block (step 159). When the current block is larger than the minimum block in step 159, the block is divided through quadtree, the quadtree structure is stored, and then returned to step 152, and further quadtree process for each sub-block is repeated (step 160).

Figure 6:
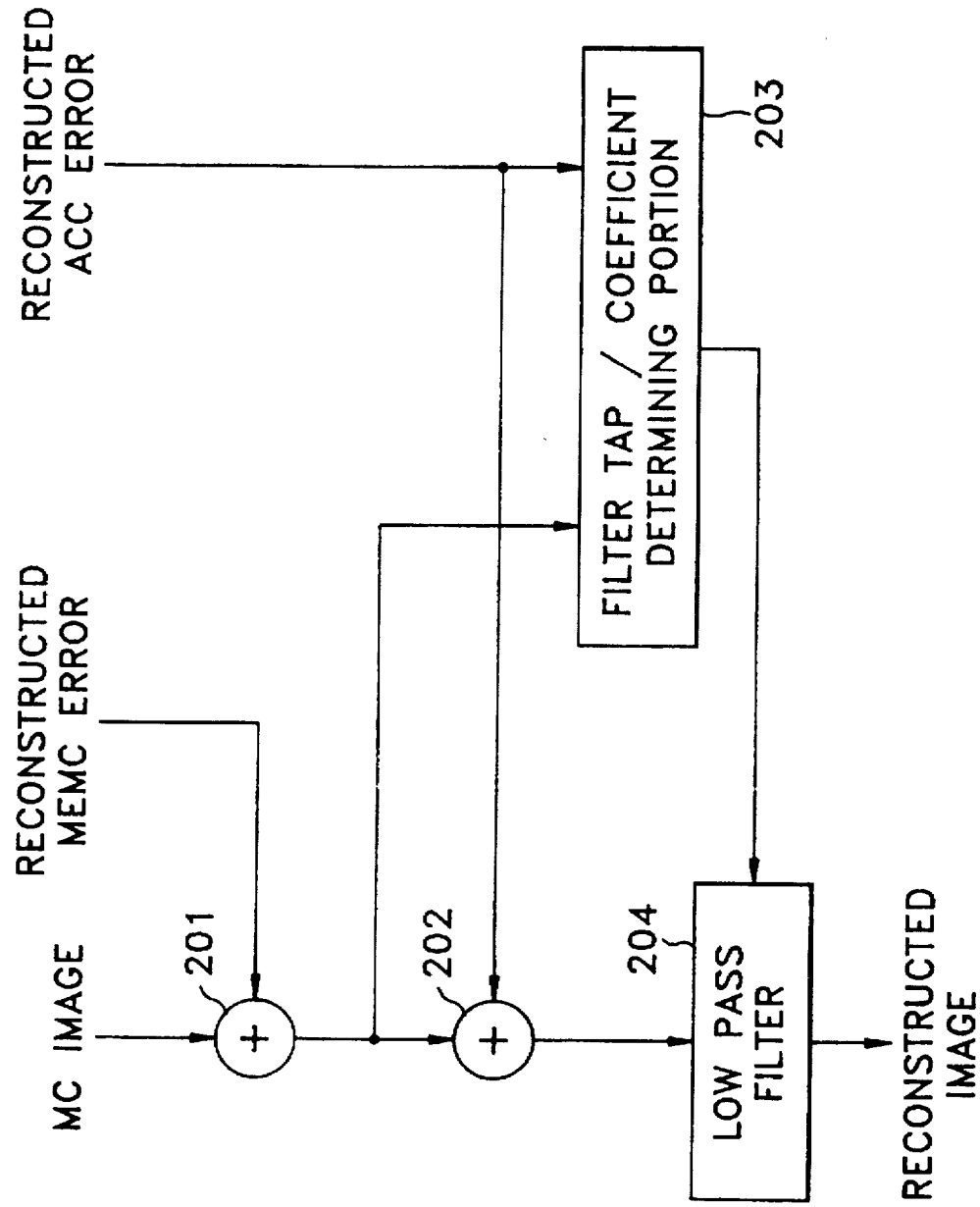
FIG. 6 is a detailed block diagram of an adder/filter shown in FIG. 3.

FIG. 6 is a detailed block diagram of adder/filter 64 shown in FIG. 3. Here, first and second adders 201 and 202, a filter tap/coefficient determining portion 203, and a low pass filter 204 are provided.

In operation of adder/filter 64 shown in FIG. 6, first adder 201 adds the motion compensated images output from motion estimator/compensator 52 of FIG. 4 to the reproduction compensation errors output from first inverse quadtree processor 62 of FIG. 4, and second adder 202 adds the output from first adder 201 to the reproduction accumulated errors output from second inverse quadtree processor 63 of FIG. 4.

Filter tap/coefficient determining portion 203 determines the number of taps according to a size of sub-blocks of the reproduction accumulated errors output from second inverse quadtree processor 63 of FIG. 4, determines a filter coefficient by dispersing images of the same size and in the same position in reconstructed images output from first adder 201. Low pass filter 204 filters the output from second adder 202 by the filter coefficient determined by filter tap/coefficient determining portion 203. In the filter coefficient of the filter tap/coefficient determiner, a coefficient value in the center of the low pass filter is larger than other coefficient values when dispersion of the motion compensated images where compensation errors of the same size and in the same position as the sub-blocks are combined, is large, but coefficient values are similar to each other when dispersion of the motion compensated images is small.

FIGS. 7A through 7I show examples schematically showing a process structure with respect to accumulated errors and compensation errors.

Figure 7A:
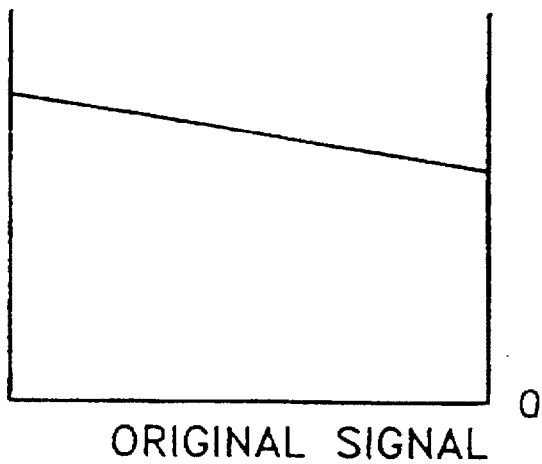
FIGS. 7A–7I show examples schematically showing a process structure with respect to accumulated errors and compensation errors.
Figure 7B:
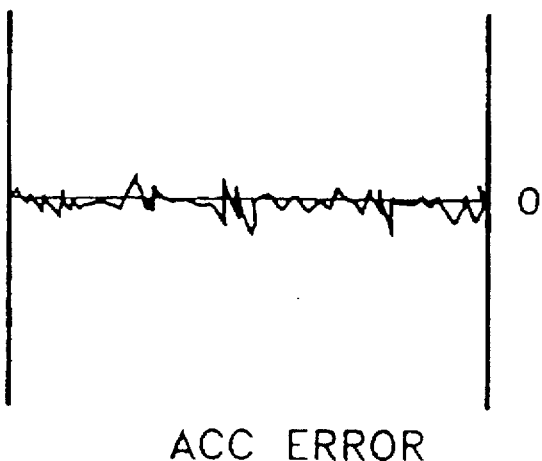
Figure 7C:
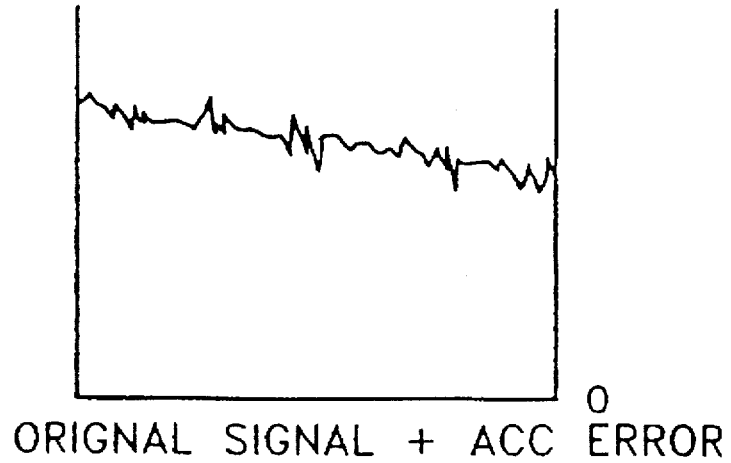
Figure 7D:
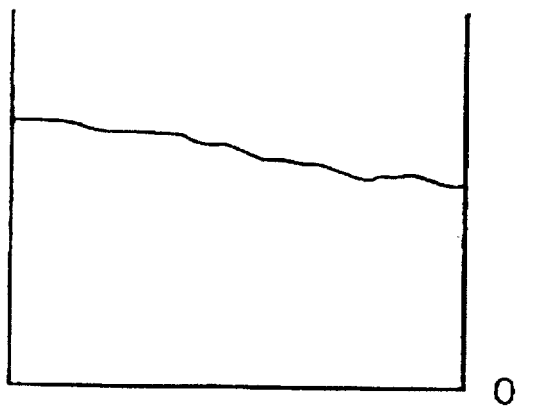
Figure 7E:
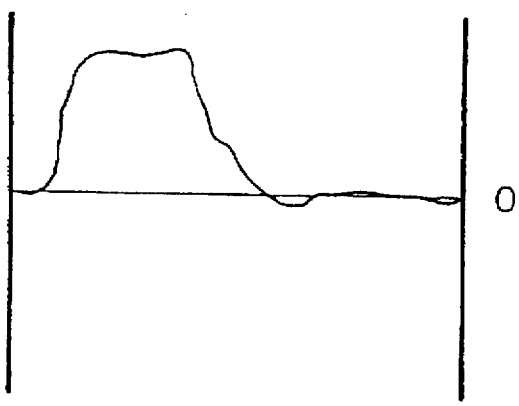
Figure 7F:
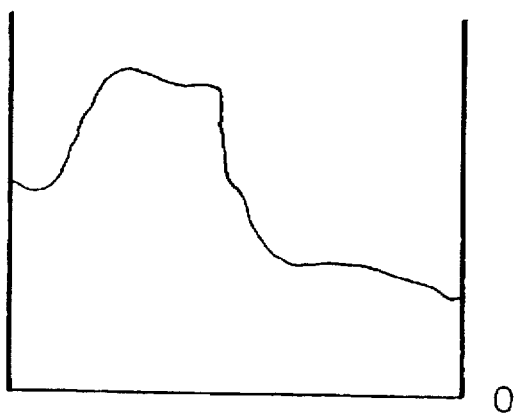
Figure 7G:
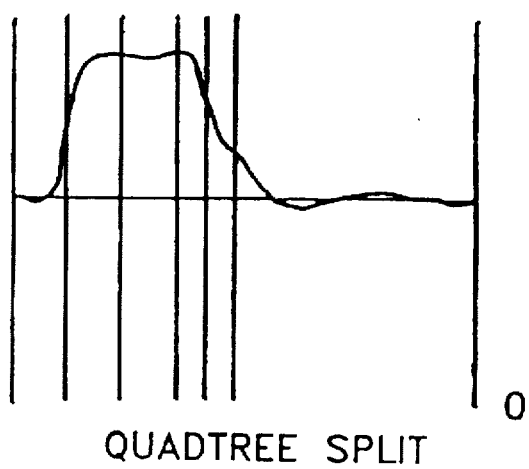
Figure 7H:
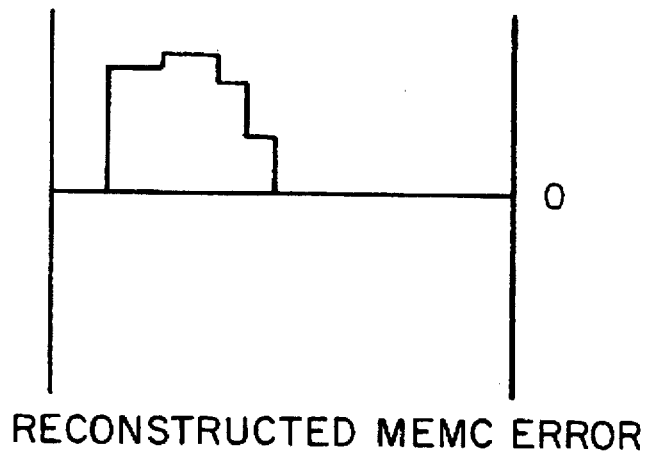
Figure 7I:
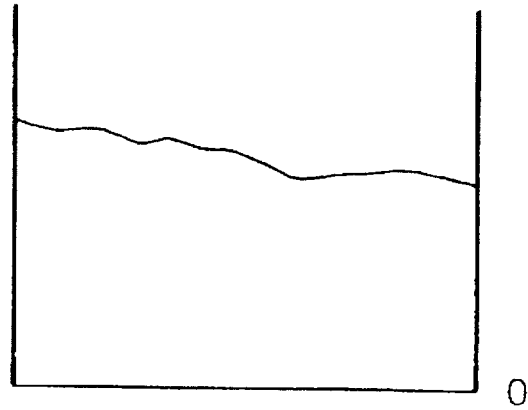

FIG. 7A shows original signals, and FIG. 7B shows accumulated errors. The accumulated errors (FIG. 7B) irregularly exist all over signal areas. FIG. 7C shows the accumulated errors (FIG. 7B) combined to the original signal (FIG. 7A). When low pass filtering is performed with respect to the signal of FIG. 7C, a reconstructed signal such as FIG. 7D can be generated. Accordingly, the reconstructed signal very similar to the original signal can be generated by only the low pass filtering, because an average value of the accumulated errors is 0 and the accumulated errors are irregularly distributed. FIG. 7E shows the compensation errors. Signal of FIG. 7F where the compensation errors exist can be gained when the compensation errors (FIG. 7E) are combined to the original signal (FIG. 7A). When the signal of FIG. 7F is divided through quadtree (but in the case of a first signal, through a binary tree), only the area such as in FIG. 7G where the compensation errors exist is divided into small pieces. The area having errors can be replaced with the average value, accordingly, the compensation errors reconstructed by using the quadtree and the average value are shown as FIG. 7H. When the signal of FIG. 7H is subtracted from the signal of FIG. 7F, reconstructed images such as FIG. 7I can be obtained. Such a quadtree method with respect to compensation errors can be very effectively processed, because the compensation errors mostly exist concentratedly on a predetermined area.

Figure 8:
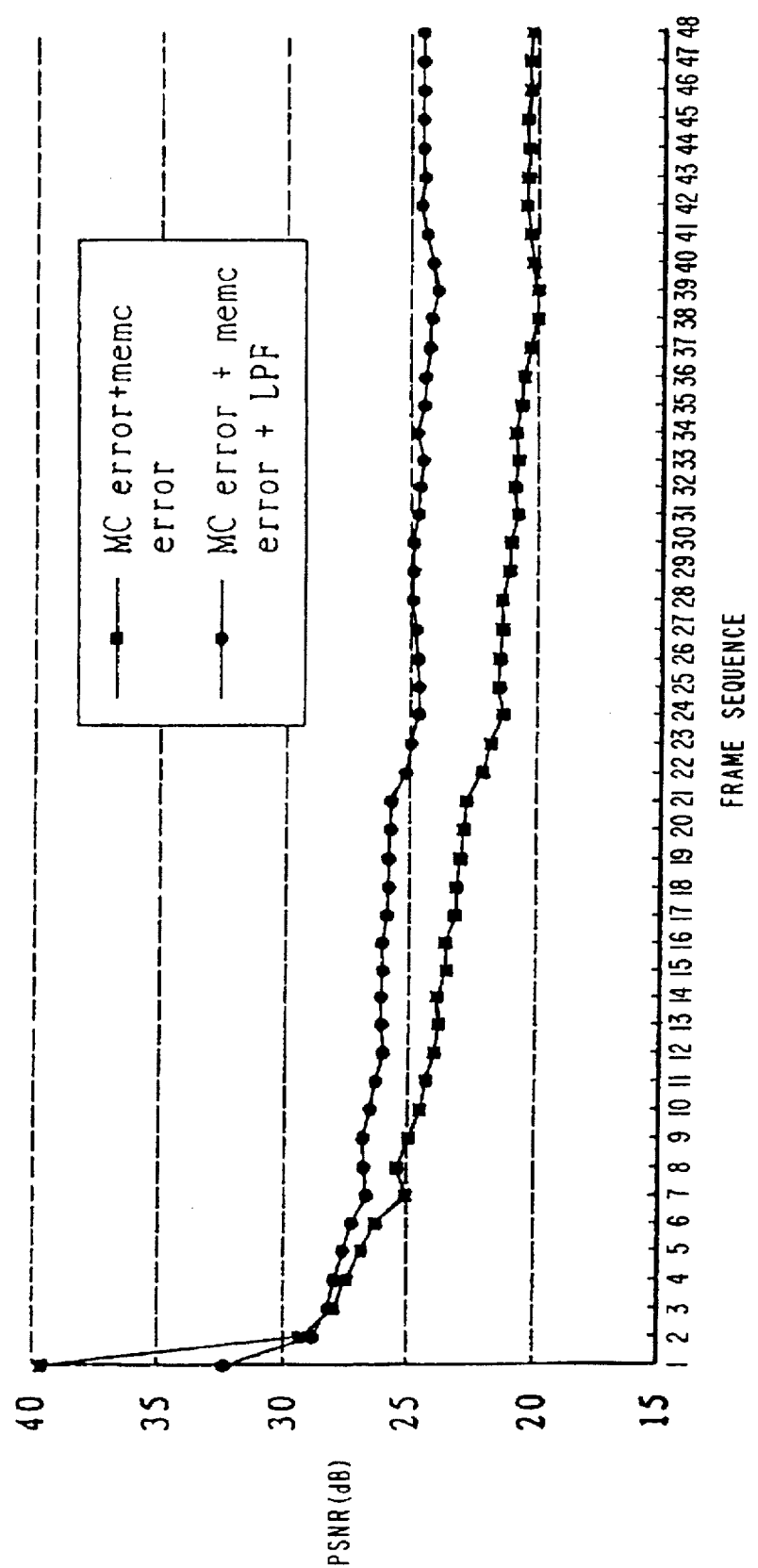
FIG. 8 shows sequences of experiment of filtering with respect to accumulated errors remaining after processing compensation errors.

FIG. 8 shows a result of experiment filtering with respect to accumulated errors remaining after processing compensation errors. The used motion image data is an image "foreman", which is sampled with 10 Hz and has a size of 352×288. The experiment shows the result filtered by simple two-dimensional five taps and a fixed coefficient value instead of adaptive filtering according to the image, accordingly, in fact, if the adaptive filtering is used, a more effective result can be expected. As shown in the result of the experiment, picture quality can be improved by 3–4 db without a particular encoding process with respect to the accumulated errors.

As described above, in a method for encoding a motion image and an apparatus therefor according to the present invention, MC error signals are divided into compensation errors and accumulated errors, concentrated errors in the compensation errors are processed through a quadtree method to encode an average value and the other errors of a small size in the compensation errors are filtered, and the accumulated errors are mostly filtered according to the characteristics and an average value of a part thereof is encoded. Accordingly, bit generation is reduced compared with the conventional DCT or quadtree method, so that it is useful for encoding the motion image with very low transmission rate.

Meanwhile, effective encoding of compensation errors facilitates to remarkably reduce a phenomenon that boundary lines of an object discord, a mosquito effect and a blocking effect through filtering so that it is effective to improve picture quality, as compared with the conventional DCT or quadtree method.

Furthermore, according to the present invention, data are processed only in the spatial area without an area transform so that it is possible to remove delay of process generated by the area transform as in the DCT. Also, accumulated errors and compensation errors can be processed through general quadtree so that a particular hardware due to particular process of errors is not required.

What is claimed is:

1. A method for encoding a motion image comprising the steps of:

(a) generating motion vectors by performing motion estimate with respect to current original images referring to previous original images, and generating motion compensated images referring to said motion vectors and reconstructed images of the previous original images;

(b) dividing MC errors generated after performing said step (a) into accumulated errors and compensation errors;

(c) quadtree-processing said accumulated and compensation errors divided in said step (b) according to the characteristic of each error;

(d) quantizing with respect to an average in each quadtree of said accumulated and compensation errors processed in said step (c), and determining a quantization coefficient according to a predetermined quantization step-size;

(e) variable-length-coding the data quantized in said step (d);

(f) storing the data output from said step (e);

(g) determining the quantization step-size to be provided to said step (d) according to a volume of said data stored in said step (f);

(h) inversely transforming said data quantized in said step (d) into the data before quantization;

(i) performing an inverse quadtree process with respect to block having an average value in a predetermined sub-block of the data output from said step (h), to generate reproduction compensation errors and accumulated errors; and (j) generating first reconstructed images from said reproduction compensation errors and accumulated errors generated from said step (i), and said motion compensated images generated from said step (a), and then generating final reconstructed images through low pass filtering.

2. A method for encoding a motion image according to claim 1, wherein in said step (c), most of said accumulated errors are processed through said low pass filtering, and only a part whose an average value is not 0 are quadtree-processed.

3. A method for encoding a motion image according to claim 1, wherein said step (c), concentrated errors of said compensation errors are encoded through said quadtree-processing, but other errors of a small size are not encoded.

4. An apparatus for encoding a motion image comprising:

a first buffer for storing previous original images and current original images;

a motion estimator/compensator for generating motion vectors by performing motion estimate with respect to said current original images referring to said previous original images stored in said first buffer, and for generating motion compensated images referring to said generated motion vectors and reconstructed images of said previous original images;

MC errors generator/divider for generating MC errors by said motion compensated images generated by said motion estimator/compensator and said current original images, and for dividing said MC errors into compensation errors and accumulated errors;

first and second quadtree processors for performing a quadtree process so as to encode said compensation and accumulated errors output from said MC error generator/divider;

a switching portion for switching and outputting said motion vectors generated by said motion estimator/compensator and the data output from said first and second quadtree processors;

a quantizer for quantizing an average value in a quadtree of the output data from said switching portion, and for determining a quantization coefficient according to a predetermined quantization step-size;

a variable length coder for performing variable length coding with respect to said data quantized by said quantizer;

a second buffer for storing the output data from said variable length coder; a bit rate controller for determining said quantization step-size to be provided to said quantizer according to a volume of the data stored in said second buffer;

an inverse quantizer for transforming said data quantized by said quantizer into the data before quantization;

first and second inverse quadtree processors for performing inverse quadtree process with respect to blocks with an average in a predetermined sub-block of said output data from said inverse quantizer, to generate reproduction compensation errors and accumulated errors; and an adder/filter for generating first reconstructed images by adding said reproduction compensation and accumulated errors output from said first and second inverse quadtree processors to said motion compensation images output from said motion estimator/compensator, and for generating final reconstructed images by processing irregularly distributed errors through filtering.

5. An apparatus for encoding a motion image according to claim 4, wherein said motion estimator/compensator comprises:

a motion estimator for generating said motion vectors by performing motion estimate with respect to current original images referring to said previous original images, a first motion compensator for generating first motion compensation images by using said motion vectors and referring to said previous original images; and a second motion compensator for generating second motion compensation images by using said motion vectors and referring to reconstructed images of said previous original images.

6. An apparatus for encoding a motion image according to claim 5, wherein said MC error generator/divider comprises:

a buffer for storing said second motion compensated images output from said second motion compensator to generate reconstructed images;

a first subtracter for generating compensation errors by obtaining a difference between said first motion compensation images output from said first motion compensator and said current original images;

a second subtracter for generating said MC errors by obtaining a difference between said second motion compensation images output from said second motion compensator and current original images; and a third subtracter for generating said accumulated errors by obtaining a difference between said MC errors output from said second subtracter and said compensation errors output from said first subtracter.

7. An apparatus for encoding a motion image according to claim 4, wherein said adder/filter comprises:

a first adder for adding said motion compensated images output from said motion estimator/compensator to said reproduction compensation errors output from said first inverse quadtree processor;

a second adder for adding the output from said first adder to said reproduction accumulated errors output from said second inverse quadtree processor; a filter tap/coefficient determiner for determining filter taps according to a block size of said reproduction accumulated errors output from said second inverse quadtree processor, and for determining a filter coefficient according to dispersion of said reconstructed images output from said second inverse quadtree processor; and a low pass filter for filtering the output of said second adder by said filter coefficient determined by said filter tap/coefficient determiner.

8. An apparatus for encoding a motion image according to claim 7, wherein the number of filter taps of said filter tap/coefficient determiner is proportional to sizes of sub-blocks of said reproduction accumulated errors output from said second inverse quadtree processor.

9. An apparatus for encoding a motion image according to claim 8, wherein in said filter coefficient of said filter tap/coefficient determiner, a coefficient value in the center of said low pass filter is larger than other coefficient values when dispersion of said motion compensated images where compensation errors of the same size and in the same position as said sub-blocks are combined, is large, but coefficient values are similar to each other when dispersion of said motion compensated images is small.

* * * * *